United States Patent
Yoshimizu et al.

(10) Patent No.: US 8,772,164 B2
(45) Date of Patent: Jul. 8, 2014

(54) METHOD FOR FORMING INTERCONNECTION PATTERN AND SEMICONDUCTOR DEVICE

(75) Inventors: Yasuhito Yoshimizu, Kanagawa-ken (JP); Satoshi Wakatsuki, Kanagawa-ken (JP); Hisashi Okuchi, Kanagawa-ken (JP); Atsuko Sakata, Kanagawa-ken (JP); Hiroshi Tomita, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 95 days.

(21) Appl. No.: 13/526,216

(22) Filed: Jun. 18, 2012

(65) Prior Publication Data

US 2013/0154087 A1 Jun. 20, 2013

(30) Foreign Application Priority Data

Dec. 15, 2011 (JP) .................. 2011-274772

(51) Int. Cl.
*H01L 21/44* (2006.01)
(52) U.S. Cl.
USPC .... 438/677; 438/618; 257/753; 257/E21.038; 257/E23.168
(58) Field of Classification Search
CPC .............. H01L 21/3205; H01L 21/76876
USPC .......... 438/618, 674, 676, 677; 257/E21.498, 257/E21.038, 753, E23.168
See application file for complete search history.

(56) References Cited

U.S. PATENT DOCUMENTS

| | | | |
|---|---|---|---|
| 8,110,497 B2 | 2/2012 | Sakata et al. | |
| 2008/0176767 A1* | 7/2008 | Millward | 506/20 |
| 2011/0009656 A1* | 1/2011 | Williams et al. | 556/9 |
| 2011/0139192 A1 | 6/2011 | Koide et al. | |
| 2011/0143541 A1 | 6/2011 | Ogawa et al. | |
| 2012/0046421 A1* | 2/2012 | Darling et al. | 525/371 |

FOREIGN PATENT DOCUMENTS

JP 2005-051151 2/2005

* cited by examiner

*Primary Examiner* — Caridad Everhart
(74) *Attorney, Agent, or Firm* — Finnegan, Henderson, Farabow, Garrett & Dunner, L.L.P.

(57) ABSTRACT

According to one embodiment, a method for forming an interconnection pattern includes forming an insulating pattern, forming a self-assembled film, and forming a conductive layer. The insulating pattern has a side surface on a major surface of a matrix. The self-assembled film has an affinity with a material of the insulating pattern on the side surface of the insulating pattern. The forming the conductive layer includes depositing a conductive material on a side surface of the self-assembled film.

17 Claims, 7 Drawing Sheets

METHOD FOR FORMING INTERCONNECTION PATTERN AND SEMICONDUCTOR DEVICE

CROSS-REFERENCE TO RELATED APPLICATIONS

This application is based upon and claims the benefit of priority from the prior Japanese Patent Application No.2011-274772, filed on Dec. 15, 2011; the entire contents of which are incorporated herein by reference.

FIELD

Embodiments described herein relate generally to a method for forming interconnection pattern and a semiconductor device.

BACKGROUND

Methods for forming an interconnection pattern include a process in which a metal is dry-etched in an interconnection configuration and a damascene process in which a metal is buried in an interconnection trench. In a method in which dry etching is used to form an interconnection pattern, a resist pattern is formed on a metal layer and the resist pattern is used as a mask to dry-etch the metal layer. Thereby, an interconnection pattern in which the configuration of the resist pattern is transferred is formed. In the damascene process, a trench is formed in an insulating layer, a metal material is buried in the trench, and the metal material provided in the portion other than the trench is ground and removed. Thereby, an interconnection pattern of the metal material is formed in the trench.

In addition, methods for forming an interconnection pattern also include a method in which electroless plating is used to deposit a conductive layer.

In such interconnection pattern formation, it is desired to form a stable configuration with high accuracy.

DETAILED DESCRIPTION

Figure 1:
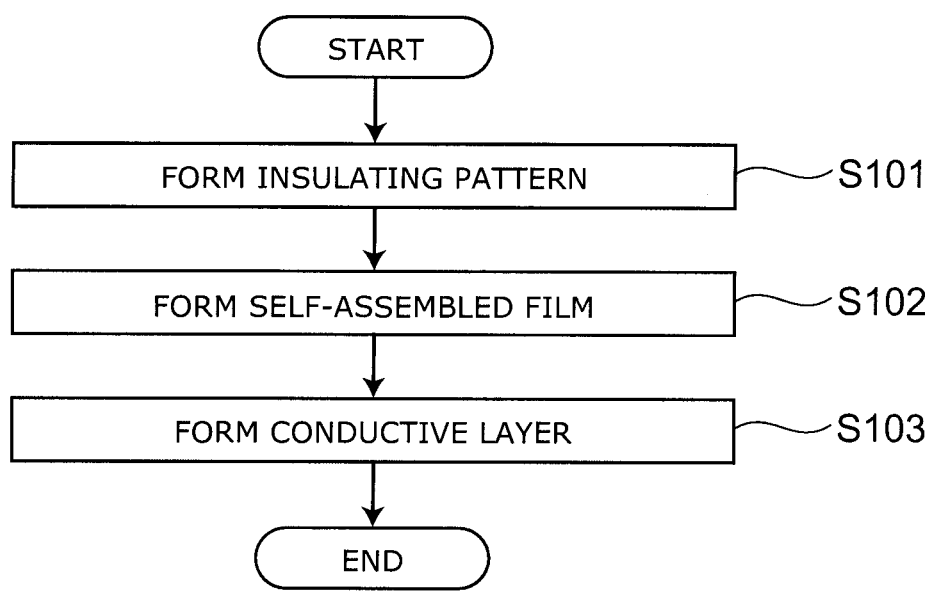
FIG. 1 is a flow chart illustrating a method for forming an interconnection pattern according to a first embodiment.

In general, according to one embodiment, a method for forming an interconnection pattern includes forming an insulating pattern, forming a self-assembled film, and forming a conductive layer. The insulating pattern has a side surface on a major surface of a matrix. The self-assembled film has an affinity with a material of the insulating pattern on the side surface of the insulating pattern. The forming the conductive layer includes depositing a conductive material on a side surface of the self-assembled film.

In general, according to one embodiment, a semiconductor device includes: a matrix, a semiconductor element being provided on the matrix; an insulating pattern provided on a major surface of the matrix and having a side surface on the major surface; a self-assembled film provided on the side surface of the insulating pattern and having an affinity with a material of the insulating pattern; and a conductive layer provided on a side surface of the self-assembled film.

Hereinbelow, embodiments of the invention are described based on the drawings.

The drawings are schematic or conceptual; and the relationships between the thickness and width of portions, the proportional coefficients of sizes among portions, etc. are not necessarily the same as the actual values thereof. Further, the dimensions and proportional coefficients may be illustrated differently among drawings, even for identical portions.

In the specification of this application and the drawings, components similar to those described in regard to a drawing thereinabove are marked with the same reference numerals, and a detailed description is omitted as appropriate.

First Embodiment

FIG. 1 is a flow chart illustrating a method for forming an interconnection pattern according to a first embodiment.

That is, as shown in FIG. 1, the method for forming an interconnection pattern according to the embodiment includes the formation of an insulating pattern (step S101), the formation of a self-assembled film (step S102), and the formation of a conductive layer (step S103).

In the formation of an insulating pattern shown in step S101, an insulating pattern having a side surface is formed on the major surface of a matrix. To form the insulating pattern, an insulating layer is formed on the major surface of the matrix, a mask pattern is formed on the insulating layer, and the insulating layer is etched via the mask pattern.

Silicon oxide, for example, is used for the insulating layer. A photoresist, for example, is used for the mask pattern.

In the formation of a self-assembled film shown in step S102, a self-assembled film having an affinity with the material of the insulating pattern is formed on the side surface of the insulating pattern. A SAM (self-assembled monolayer) containing a silanol group and an amino group as a counter group to the silanol group, for example, is used as the self-assembled film.

In the case where the insulating pattern contains silicon oxide, the self-assembled film contains a silane coupling agent that adsorbs only to silicon oxide.

In the formation of a conductive layer shown in step S103, a conductive material is deposited on the side surface of the self-assemble film to form a conductive layer. The side surface of the self-assembled film refers to the surface on the opposite side to the insulating pattern out of the surfaces of the self-assembled film. To form the conductive layer, first, a catalyst is provided to the self-assembled film. The catalyst adheres well via the self-assembled film. After that, electroless plating for depositing the conductive material is performed via the catalyst. Thereby, the conductive material is deposited on the side surface of the insulating pattern with a prescribed thickness to form an interconnection pattern.

FIG. 2A to FIG. 4B are schematic cross-sectional views showing a specific example of the method for forming an interconnection pattern according to the first embodiment.

Figure 2A:
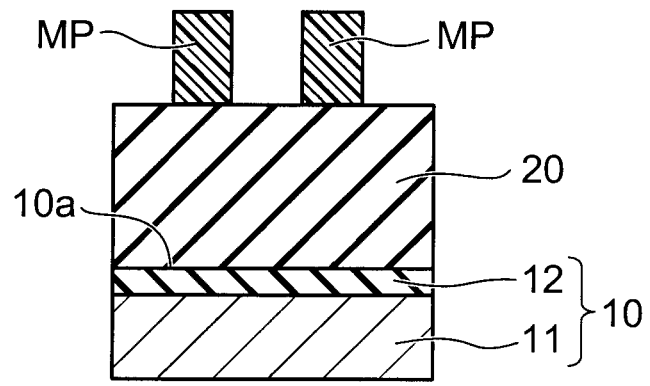
FIG. 2A to FIG. 4B are schematic cross-sectional views showing a specific example of the method for forming an interconnection pattern according to the first embodiment.

First, as shown in FIG. 2A, an underlayer 12 is formed on a substrate 11. Silicon, for example, is used for the substrate 11. The substrate 11 may be also a semiconductor substrate other than silicon or an insulating substrate of glass etc. Furthermore, the substrate 11 may be a structure in which a semiconductor layer is formed on an insulating substrate. Also those in which circuits and elements are formed are included in examples of the substrate 11.

A material by which a self-assembled film is not formed on the exposed surface of the underlayer 12 is used for the underlayer 12. Silicon nitride, for example, is used as the underlayer 12.

In the case where treatment for preventing a self-assembled film from being formed on the surface of the substrate 11 is performed, the underlayer 12 is not necessary. For example, pretreatment with buffered hydrofluoric acid (BHF) is performed on the surface of the substrate 11 made of silicon to hydrogen-terminate the surface; thereby, a self-assembled film will not be formed. In the case where such pretreatment is performed, the underlayer 12 does not need to be provided.

In the embodiment, a matrix 10 includes the substrate 11. In the case where the underlayer 12 is provided, the matrix 10 includes the substrate 11 and the underlayer 12. In the description of the embodiment, an example is used in which the matrix 10 includes the substrate 11 and the underlayer 12.

Next, an insulating film 20 is formed on the major surface 10a of the matrix 10 (the upper surface of the underlayer 12). Silicon oxide formed by CVD (chemical vapor deposition) using TEOS (tetraethyl orthosilicate), for example, is used for the insulating film 20. The thickness of the insulating film 20 corresponds to the height of the interconnection pattern to be formed.

Next, a mask pattern MP is formed on the insulating film 20. The mask pattern MP is obtained by, for example, patterning a photoresist by photolithography and etching.

Figure 2B:
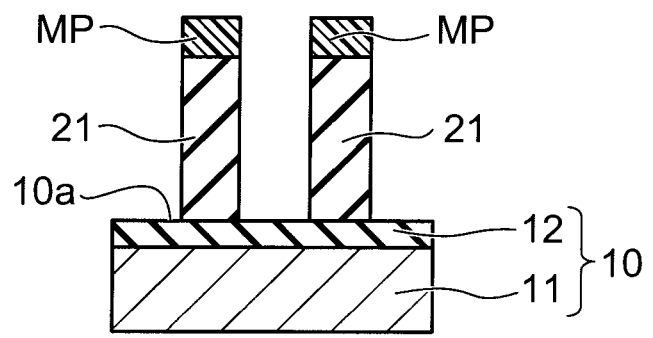

Next, as shown in FIG. 2B, the insulating film 20 is etched via the mask pattern MP to form an insulating pattern 21. A portion of the insulating film 20 where the mask pattern MP is not formed is removed by, for example, RIE (reactive ion etching). By the etching, the insulating film 20 left in the portion where the mask pattern MP is formed forms the insulating pattern 21. The insulating film 20 in the portion where the mask pattern MP is not formed is removed until the underlayer 12 becomes exposed.

As an example, the width of the insulating pattern 21 is approximately 20 nanometers (nm), and the spacing between two adjacent portions of the insulating pattern 21 is approximately 20 nm.

Figure 2C:
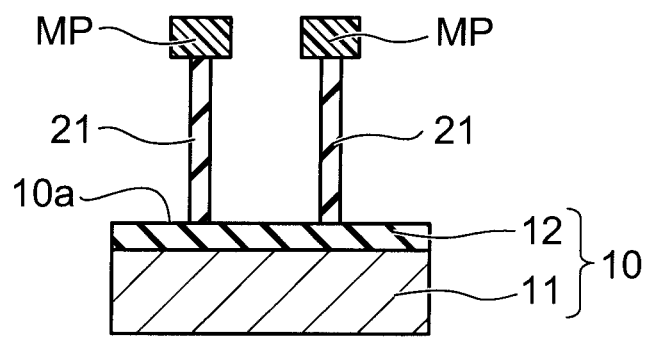

Next, as shown in FIG. 2C, the slimming of the insulating pattern 21 is performed as necessary. In the case of performing slimming, the width of the insulating pattern 21 is made thinner than the width of the mask pattern MP while the mask pattern MP is left. In the case where the insulating pattern 21 contains silicon oxide, slimming is performed by etching with buffered hydrofluoric acid (BHF). By using buffered hydrofluoric acid, only the insulating pattern 21 containing silicon oxide can be etched to adjust the width of the insulating pattern 21 while the mask pattern MP that is a photoresist is left.

As an example, the width of the insulating pattern 21 after slimming is approximately 5 nm, and the spacing between two adjacent portions of the insulating pattern 21 is approximately 35 nm.

Figure 3A:
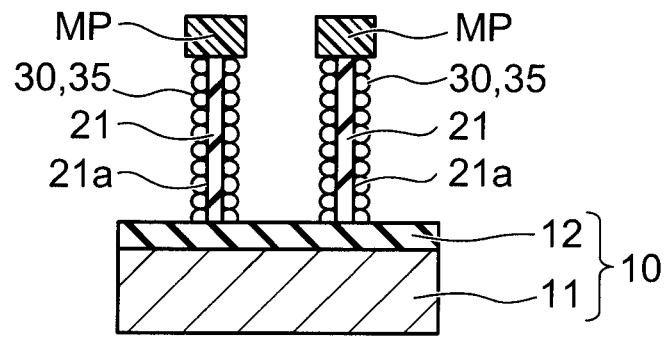

Next, as shown in FIG. 3A, a self-assembled film 30 is formed on the side surface 21a of the insulating pattern 21. The self-assembled film 30 contains a functional group that bonds to the material of the insulating pattern 21.

To form the self-assembled film 30, the insulating pattern 21 on which the mask pattern MP remains is immersed in a solvent containing the material of the self-assembled film 30.

In the embodiment, the self-assembled film 30 is formed only on the side surface 21a of the insulating pattern 21. That is, the upper side (the upper surface) of the insulating pattern 21 is covered with the mask pattern MP. Furthermore, the self-assembled film 30 is not formed on the underlayer 12. Therefore, the self-assembled film 30 adsorbs or bonds only to the side surface 21a of the insulating pattern 21.

A SAM containing a silanol group and an amino group as a counter group to the silanol group, for example, is used as the self-assembled film 30. The silanol group has a high affinity with silicon oxide.

In the case where the insulating pattern 21 contains silicon oxide, the self-assembled film 30 is preferably one containing a silane coupling agent that adsorbs only to silicon oxide.

Next, a catalyst 35 is provided to the self-assembled film 30. In terms of the drawing, the catalyst 35 is shown in common with the self-assembled film 30. A material having a high capability of reducing the metal material of the interconnection pattern (e.g. palladium) is used as the catalyst 35. To provide the catalyst 35, the insulating pattern 21 on which the self-assembled film 30 is formed is immersed in a solvent containing the catalyst metal. Thereby, the catalyst 35 bonds to the functional group (e.g. amino group) of the SAM that is the self-assembled film 30.

As an example, the width of the insulating pattern 21 including the self-assembled film 30 and the catalyst 35 is approximately 10 nm, and the spacing between two adjacent portions of the insulating pattern 21 is approximately 30 nm.

Figure 3B:
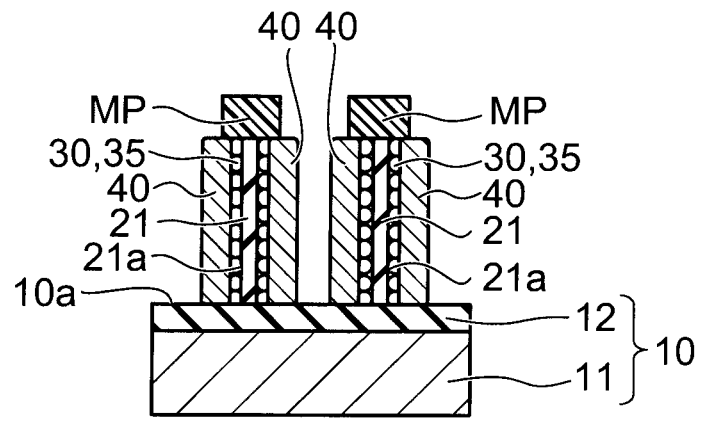

Next, as shown in FIG. 3B, a conductive material is deposited via the catalyst 35 provided to the self-assembled film 30, and a conductive layer 40 is formed. Nickel (Ni), for example, is used as the conductive material.

To deposit the conductive material, the insulating pattern 21 provided with the catalyst 35 is immersed in a metal solvent containing the conductive material. The conductive material deposits in the direction orthogonal to the side surface 21a of the insulating pattern 21. The thickness (the thickness in the direction orthogonal to the side surface 21a) of the deposition of the conductive material corresponds to the width of the interconnection pattern.

Since the insulating pattern 21 has two opposed side surfaces 21a, the conductive material deposits in mutually opposite directions around the insulating pattern 21. Consequently, the conductive layer 40 is individually formed on both sides around the insulating pattern 21. The thickness of the deposition of the conductive material, that is, the width of the interconnection pattern is set in accordance with the deposition time (immersion time) of the conductive material.

As an example, the thickness of the conductive layer 40 (the width of the interconnection pattern) is approximately 30 nm, and the spacing between two adjacent conductive layers 40 (the spacing between two adjacent portions of the interconnection pattern) is approximately 10 nm.

Figure 3C:
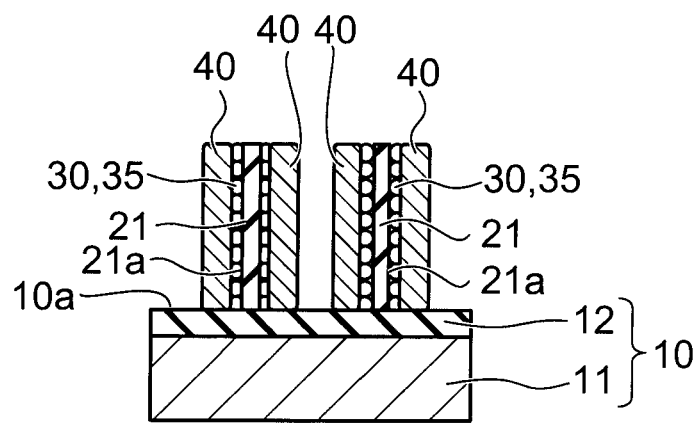
Figure 4A:
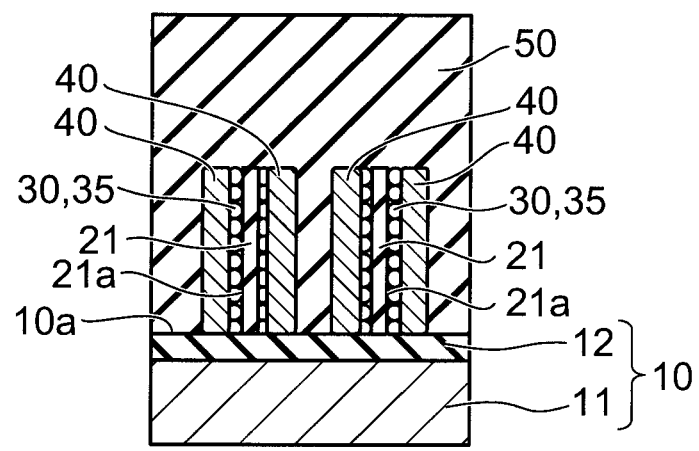

Next, as shown in FIG. 3C, the mask pattern MP on the insulating pattern 21 is removed. Next, as shown in FIG. 4A, an insulating member 50 is buried in the space between conductive layers 40. A PSZ (polysilazane), for example, is used for the insulating member 50.

As an example, the insulating member 50 is formed with a thickness of approximately 1000 nm.

Figure 4B:
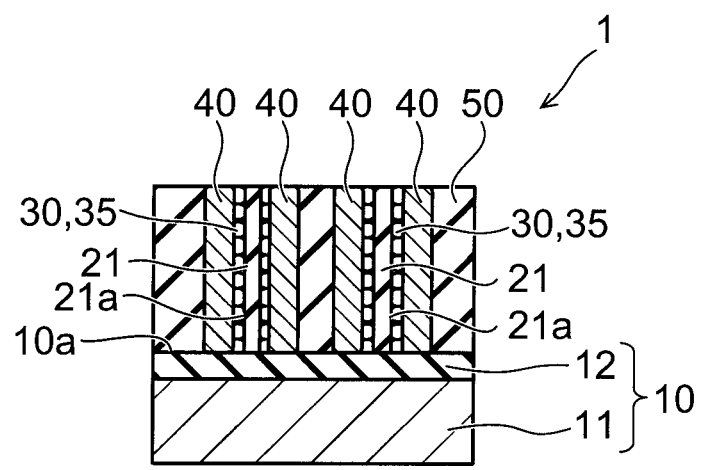

After that, as shown in FIG. 4B, the surface of the insulating member 50 is planarized by, for example, CMP (chemical mechanical polishing). The surface of the insulating member 50 is planarized until the conductive layer 40 becomes exposed. Thereby, an interconnection pattern 1 according to the embodiment is completed.

Here, if the interconnection pattern is formed by dry etching, washing for removing the etching residue is necessary. Furthermore, there is a concern that the etching residue will not be completely removed by washing or the dimensions of the interconnection will vary due to washing treatment. Furthermore, it is feared that after-corrosion will be caused after washing. In addition, concerns remain in regard to the resistance variation due to a halogen-based impurity that is implanted into a metal and not completely washed out.

In the first embodiment, since such dry etching is not used for the formation of the interconnection pattern 1, concerns like the above are not caused.

Furthermore, in the first embodiment, since the conductive layer 40 is formed on the side surface 21a of the insulating pattern 21, the conductive layer 40 is supported by the insulating pattern 21 with reliability. Therefore, even a thin and deep interconnection pattern 1 can be stably formed with good accuracy.

The method for forming the interconnection pattern 1 according to the embodiment leads to a configuration in which two conductive layers 40 are opposed to each other around the insulating pattern 21. Therefore, by using a material with a low dielectric constant (e.g. SiOC, Si, O, C, and F) as the insulating pattern 21, a reduction in the interlayer capacitance between two opposed conductive layers 40 is achieved.

On the other hand, by using a material with a high dielectric constant (e.g. HfSiO and an oxide of Al, Ta, Ti, Si, a rare earth metal such as La and Hf, etc.) as the insulating pattern 21, a capacitor with a large capacitance is formed.

Second Embodiment

Next, a method for forming an interconnection pattern according to a second embodiment is described.

FIG. 5A to FIG. 6C are schematic cross-sectional views illustrating the method for forming an interconnection pattern according to the second embodiment.

Figure 5A:
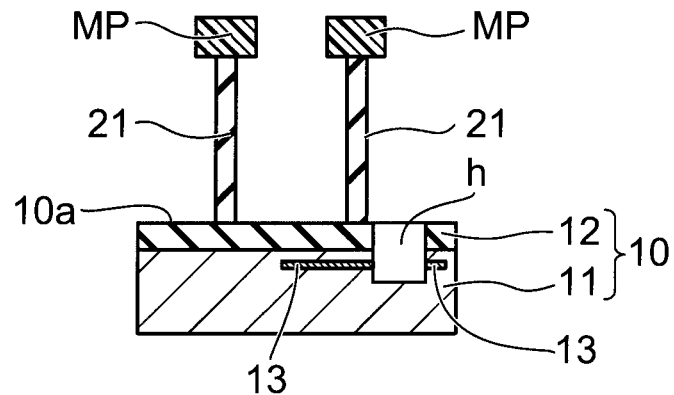
FIG. 5A to FIG. 6C are schematic cross-sectional views illustrating a method for forming an interconnection pattern according to a second embodiment.

First, as shown in FIG. 5A, the insulating pattern 21 is formed. The formation of the insulating pattern 21 is similar to that of the first embodiment described above (see FIGS. 2A to 2C). Next, an opening h is formed in the matrix 10 near the insulating pattern 21.

A metal interconnection 13 formed in the matrix 10 is exposed at the inner wall of the opening h. The metal interconnection 13 is electrically connected to, for example, a semiconductor element 100 provided on the substrate 11.

The opening h may be formed either after the insulating pattern 21 is formed or before the insulating pattern 21 is formed.

Figure 5B:
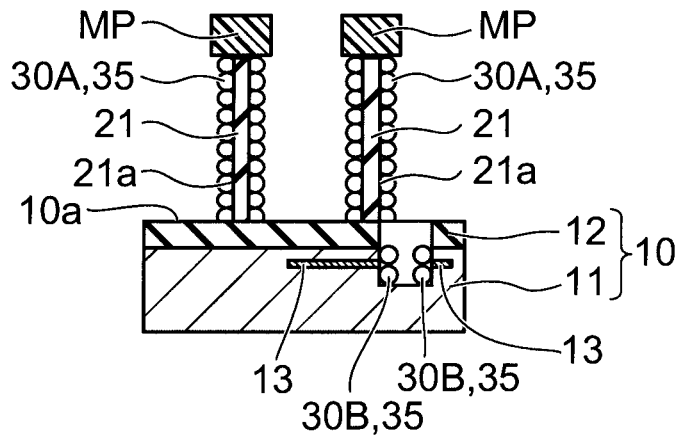

Next, as shown in FIG. 5B, a first self-assembled film 30A is formed on the side surface 21a of the insulating pattern 21, and a second self-assembled film 30B is formed on the inner wall of the opening h. The first self-assembled film 30A is the same as the self-assembled film 30 used in the first embodiment.

The second self-assembled film 30B adsorbs or bonds to the metal interconnection 13 exposed at the inner wall of the opening h. A SAM containing a thiol group and an amino group as a counter group to the thiol group, for example, is used as the second self-assembled film 30B.

Since the thiol group bonds only to metals (gold, silver, copper, etc.), the second self-assembled film 30B does not adhere to the side surface 21a of the insulating pattern 21, the surface of the underlayer 12, and the surface of the mask pattern MP. The second self-assembled film 30B may be also a SAM containing a disulfide group that bonds only to metals.

Next, the catalyst 35 is provided to the first self-assembled film 30A and the second self-assembled film 30B. In terms of the drawing, the catalyst 35 is shown in common with the self-assembled films 30A and 30B. A material having a high capability of reducing the metal material of the interconnection pattern (e.g. palladium) is used as the catalyst 35.

Figure 5C:
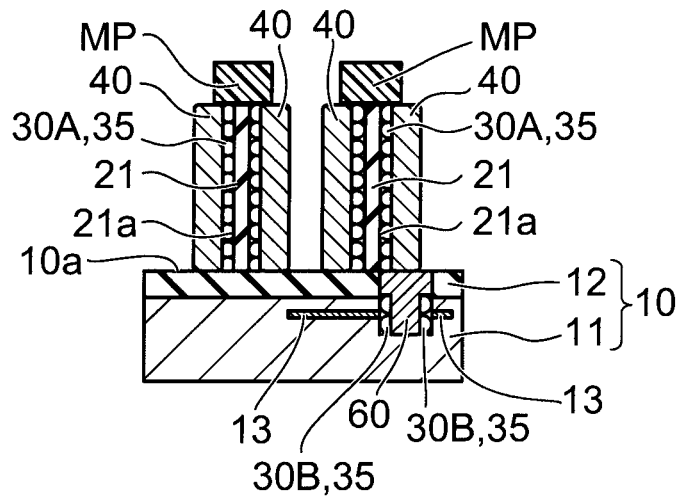

Next, as shown in FIG. 5C, a conductive material is deposited via the catalyst 35 provided to the first self-assembled film 30A and the second self-assembled film 30B, and the conductive layer 40 is formed on the side surface 21a of the insulating pattern 21; and a via 60 is formed in the opening h. Nickel (Ni), for example, is used as the conductive material. The conductive material (the conductive layer 40) deposited on the side surface 21a of the insulating pattern 21 is joined to the conductive material (the via 60) deposited on the inner wall of the opening h. Thereby, the conductive layer 40 is electrically connected to the via 60.

Figure 6A:
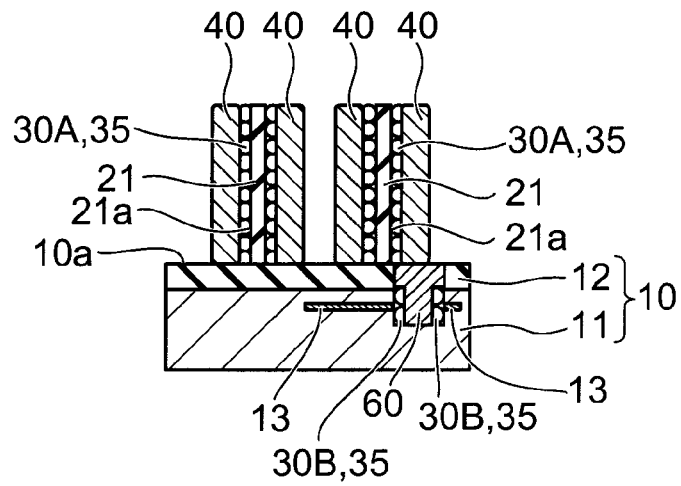
Figure 6B:
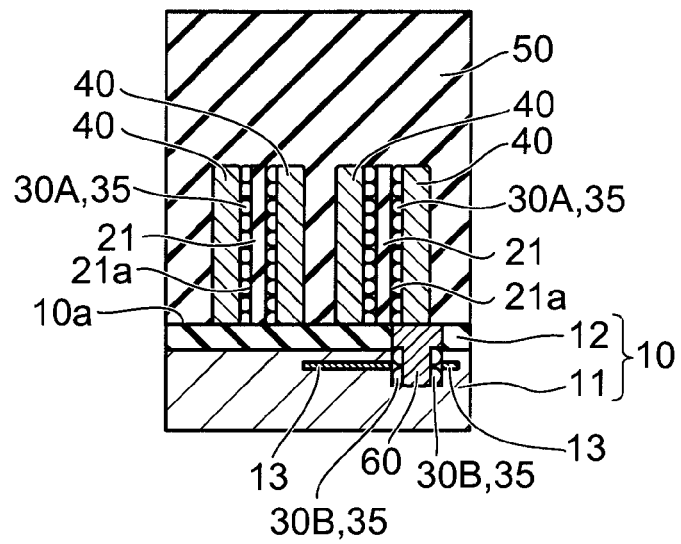
Figure 6C:
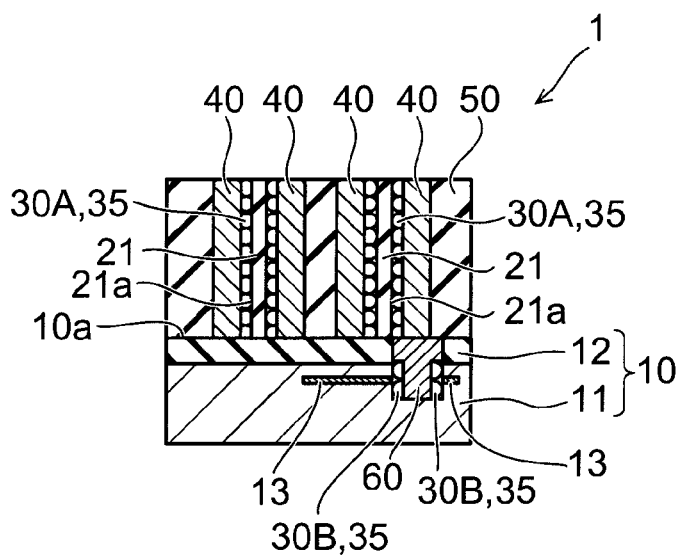

Next, as shown in FIG. 6A, the mask pattern MP on the insulating pattern 21 is removed. Next, as shown in FIG. 6B, the insulating member 50 is buried in the space between conductive layers 40. A PSZ, for example, is used for the insulating member 50. After that, as shown in FIG. 6C, the surface of the insulating member 50 is planarized by, for example, CMP. The surface of the insulating member 50 is planarized until the conductive layer 40 becomes exposed. Thereby, the interconnection pattern 1 according to the embodiment is completed.

In the second embodiment, in addition to similar operation and effect to the first embodiment, the conductive layer 40 and the via 60 electrically connected to the conductive layer 40 can be collectively formed by electroless plating.

Third Embodiment

Next, a semiconductor device according to a third embodiment is described.

Figure 7:
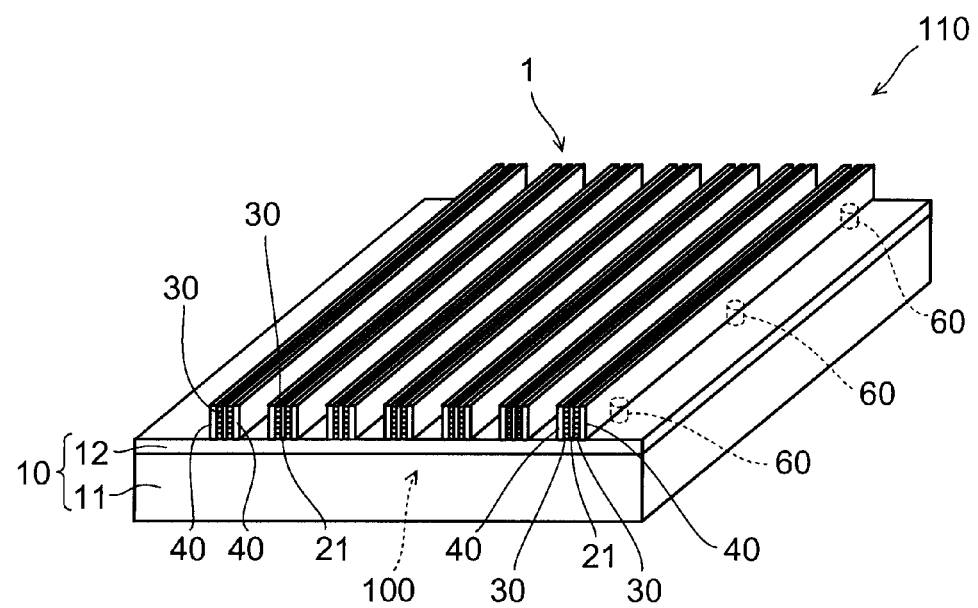
FIG. 7 is a schematic perspective view illustrating a semiconductor device according to a third embodiment.

FIG. 7 is a schematic perspective view illustrating the semiconductor device according to the third embodiment.

As shown in FIG. 7, a semiconductor device 110 includes the matrix 10 on which the semiconductor element 100 is provided, the insulating pattern 21 provided on the major surface 10a of the matrix 10 and having the side surface 21a on the major surface 10a, the self-assembled film 30 provided on the side surface 21a of the insulating pattern 21, and the conductive layer 40 provided on the side surface of the self-assembled film 30. A material having a high capability of reducing the metal material of the conductive layer 40 (e.g. palladium) may be contained in the conductive layer 40.

Of the configuration mentioned above of the semiconductor device 110, the insulating pattern 21, the self-assembled film 30, and the conductive layer 40 constitute the interconnection pattern 1. To form the interconnection pattern 1, one of the first embodiment and the second embodiment described above may be used. In the case where the second embodiment is used, the conductive layer 40 is electrically connected to the via 60. The conductive layer 40 is electrically connected to the semiconductor element 100 via the via 60.

A not-shown protection member 50 is provided on the interconnection pattern 1, and the surface is planarized as necessary. In the semiconductor device 110, a plurality of interconnection patterns 1 may be stacked. In this case, at least one of the first embodiment and the second embodiment described above may be repeated to stack interconnection patterns 1 one after another. Another layer (a semiconductor layer and/or an insulating layer) may be interposed between interconnection patterns 1 stacked.

By the semiconductor device 110 thus configured, the operational reliability can be improved and the manufacturing yield can be increased by the interconnection pattern 1 stably formed with good accuracy.

As described above, the embodiment can provide a method for forming a stable interconnection pattern and a semiconductor device of a stable interconnection pattern.

Although embodiments are described above, the invention is not limited to these examples. For example, as the substrate 11, in addition to a semiconductor substrate other than silicon and an insulating substrate of glass etc., a structure in which a semiconductor layer is formed on an insulating matrix may be used. Furthermore, the self-assembled films 30, 30A, and 30B may be a material other than the above. Moreover, one skilled in the art may appropriately make additions, removals, and design changes of components to the embodiments described above, and may appropriately combine features of the embodiments; such modifications also are included in the scope of the invention to the extent that the spirit of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for forming an interconnection pattern comprising:
    forming an insulating pattern having a side surface on a major surface of a matrix;
    forming a self-assembled film having an affinity with a material of the insulating pattern on the side surface of the insulating pattern; and
    forming a conductive layer by depositing a conductive material on a side surface of the self-assembled film,
    the forming the insulating pattern including forming an insulating layer on the major surface if the matrix, forming a mask pattern on the insulating layer, and etching the insulating layer via the mask pattern, and
    the forming the insulating pattern includes making a width of the insulating pattern thinner than a width of the mask pattern while leaving the mask pattern after etching the insulating layer via the mask pattern.

2. The method according to claim 1, wherein
    the insulating pattern contains silicon oxide and
    the self-assembled film contains a silane coupling agent that adsorbs only to the silicon oxide.

3. The method according to claim 1, wherein the forming the insulating pattern includes treatment of hydrogen-terminating the major surface of the matrix.

4. The method according to claim 1, wherein the self-assembled film contains a silanol group and an amino group of a counter group to the silanol group.

5. The method according to claim 1, wherein the forming the conductive layer includes providing a catalyst to the self-assembled film and depositing the conductive material via the catalyst.

6. The method according to claim 5, wherein the catalyst contains palladium.

7. The method according to claim 1, further comprising:
    covering a portion around the conductive layer with an insulative interlayer film on the major surface; and
    exposing the conductive layer at a surface of the interlayer film.

8. The method according to claim 7, wherein the exposing the conductive layer includes performing chemical mechanical polishing on a surface of the interlayer film.

9. The method according to claim 1, wherein the matrix includes an underlayer on the major surface side.

10. The method according to claim 1, wherein the underlayer contains silicon nitride.

11. A semiconductor device comprising:
    a matrix, a semiconductor element being provided on the matrix;
    an insulating pattern provided on a major surface of the matrix and having a side surface above the major surface;
    a self-assembled film provided on the side surface of the insulating pattern, not being provided on an upper surface of the insulating pattern and having an affinity with a material of the insulating pattern; and
    a conductive layer provided on a side surface of the self-assembled film.

12. The device according to claim 11, wherein the insulating pattern contains silicon oxide.

13. The device according to claim 11, wherein the self-assembled film contains a silanol group and an amino group of a counter group to the silanol group.

14. The device according to claim 11, wherein a catalyst is provided between the self-assembled film and the conductive layer.

15. The device according to claim 14, wherein the catalyst contains palladium.

16. The device according to claim 11, wherein an underlayer is provided between the matrix and the insulating pattern.

17. The device according to claim 16, wherein the underlayer contains silicon nitride.

* * * * *